United States Patent [19]

Bardell, Jr. et al.

[11] Patent Number: 5,442,640

[45] Date of Patent: Aug. 15, 1995

[54] TEST AND DIAGNOSIS OF ASSOCIATED OUTPUT LOGIC FOR PRODUCTS HAVING EMBEDDED ARRAYS

[75] Inventors: Paul H. Bardell, Jr., Carmel; Jacob Savir, Mahopac, both of N.Y.

[73] Assignee: International Business Machines Corporation, Armonk, N.Y.

[21] Appl. No.: 350,753

[22] Filed: Dec. 7, 1994

Related U.S. Application Data

[63] Continuation of Ser. No. 5,724, Jan. 19, 1993, abandoned.

[51] Int. Cl.6 ............... G01R 31/28; G01R 15/12
[52] U.S. Cl. ................... 371/21.1; 371/22.1; 371/22.4
[58] Field of Search ............ 371/21.1, 22.1, 21.2, 371/22.3–22.5, 22.6, 67.1; 324/73 R

[56] References Cited

U.S. PATENT DOCUMENTS

| | | | |
|---|---|---|---|
| 3,961,252 | 6/1976 | Eichelberger | 324/73 |
| 3,961,254 | 6/1976 | Cavaliere et al. | 324/73 |
| 4,404,519 | 9/1983 | Westcott | 324/73 R |
| 4,608,669 | 8/1986 | Klara et al. | 365/201 |
| 4,872,168 | 10/1989 | Aadsen et al. | 371/21.3 |
| 5,173,906 | 12/1992 | Dreibelbis et al. | 371/22.5 |

*Primary Examiner*—Hoa T. Nguyen
*Attorney, Agent, or Firm*—Aziz M. Ahsan

[57] ABSTRACT

This invention addresses the testing and diagnosis of failures in the post-logic of products having embedded arrays. The post-logic is the combinational logic that is fed by the embedded array. Since there is no direct access to the post-logic (no direct controllability) it requires special handling. The testing method comprises initializing the array to random values; choosing an address from the array; reading out the information from that address, while applying random signals at the primary inputs. This process is continued for a predetermined number of cycles, while holding that address and applying different random signals at the primary inputs. The process is then repeated while choosing different addresses from the array. Fault diagnosis is accomplished by means of a notebook that retains the past history of the addresses chosen from the array.

3 Claims, 2 Drawing Sheets

TEST AND DIAGNOSIS OF ASSOCIATED OUTPUT LOGIC FOR PRODUCTS HAVING EMBEDDED ARRAYS

This application is a continuation of application Ser. No. 08/005,724, filed Jan. 19, 1993, now abandoned.

BACKGROUND OF THE INVENTION

1. Technical Field

Many electronic products today incorporate one or more memory arrays. These electronic products having memory arrays further include address and data registers and associated combinatorial and/or sequential logic circuitry. These memory arrays are deemed "embedded" if the memory arrays are not directly accessible, either in whole or in part from the input or output lines to the product. This present invention is directed to random pattern testing of such electronic products having embedded arrays. Electronic products designs utilizing "boundary scan circuits" for embedded arrays refer to design methods having sets of shift register latches which facilitates a logical separation between associated logic and embedded arrays. This logical separation facilitates independent testing of the associated logic and the embedded array for which a variety of test approaches have proven to be effective. More particularly, the present invention is directed to testing electronic products based on one or more embedded arrays not having boundary scan circuits at their inputs and outputs.

The electronic product designs which do not employ shift register latches for boundary scan isolation is the focus of this present invention. Unless otherwise noted, all the citations in this present disclosure in reference to embedded arrays are based on electronic designs wherein one or more embedded arrays do not have boundary scan isolation circuitry at their inputs and outputs.

The need for improved testing methods in integrated circuit products has grown with increased packaging density. The cost effectiveness of testing methods is the result of many distinct factors. One factor in testing methods includes the time for performing a test, wherein an increase in testing time translates to an increase in manufacturing time, which in turn translates to an increase in cost. Another factor in testing methods includes a range or extent of test coverage, that is, to what extent does the test methodology exercise every component, and test every interconnection. Still another aspect of testing methods includes an ability not only to catch a fault, but also, an ability to determine at what location the fault occurred. In product failure analysis, it is this ability to find the location of the fault that guides the manufacturing process to problem correction. For example, during failure analysis related to a specific location, a corrective action for a faulty connector or a solder bridge is seen to be different than a corrective action due to damage from microscopic debris, and different still, than a corrective action for a design error. Still another factor in integrated circuit products testing is the cost associated with adding additional hardware, specifically the cost of components and interconnections, necessary to enable a particular testing method to be carried out. The self-evident conclusion is to minimize the addition of hardware whenever possible. Manufacturers must therefore balance the considerations of test time, test coverage, test hardware expense, and an ability to establish a specific location of a test failure when improving upon current methods of electronic product testing.

For products having embedded arrays without boundary scan circuits at their inputs and outputs, typical logic testing methods exist. In order to review a typical logic testing method, let us first consider the common components of a typical electronic product with embedded arrays. A typical electronic product comprises embedded arrays having memory address registers, memory data registers, and associated memory logic. "Primary inputs" and "primary outputs" are the physical pins or connectors through which the electronic product receives and transmits information to external devices. The embedded arrays of the electronic product further include data inputs and data outputs. The associated memory logic is typically combinatorial and can be further divided into two types, associated memory pre-logic and associated memory post-logic. The associated memory pre-logic connects primary inputs of the electronic product to the data inputs of the embedded arrays while the associated memory post-logic connects the data outputs of the embedded arrays to primary outputs. In addition, the associated memory logic is often accompanied by feed-around logic that connect memory pre-logic circuits with memory post-logic circuits independently of the embedded array. More particularly, feed-around logic circuits connect to post-logic circuits as do the data outputs of the embedded array. Post-logic circuits produce output strings that are channeled out through the primary outputs of the electronic product. The output strings are collected by a signature register connected to the primary output for failure detection. For the present invention, the typical logic circuit testing methodology for electronic products having embedded arrays focuses on testing both the embedded memory array and its associated logic.

The typical logic testing method for products having embedded arrays can be broken down into a few distinct steps. The steps begin with the initialization of all the embedded arrays to random values. As used herein and in the appended claims, "random" refers both to random and quasi-random processes. Next, random read tests are performed while random data is applied to the primary inputs of the associated pre-logic circuits. Continuing further, the outputs of the associated pre-logic circuits are connected through the feed-around logic to the post-logic circuits. During the random read portion of the test, the random initialized values are read into the post-logic via the embedded arrays while signals coming from the feed-around logic are fed into post-logic circuits. Post-logic circuits produce output pattern sequences which output on the primary outputs of the electronic product. The output pattern sequences are collected by a signature register. In a separate external apparatus (not shown), signature analysis is performed on the output pattern sequences collected in the signature register. If during a signature analysis a deviation from an expected pattern is found, then a problem is flagged. In order to gain higher statistical test confidence, the previous random read step is repeated. Each time the random read step is repeated, it is usually necessary to go through the procedure to rewrite random values into the embedded arrays. Repeating the rewrite step ensures that fresh random values have been stored, thereby enhancing a probability of detecting pattern resistant faults. In addition, all throughout this testing phase, embedded arrays are operated in a read only mode. The advantage gained by using the embedded arrays in only the read mode during logic circuit testing is that there is no need to use a sequential fault simulator that is normally needed to track the past history of the inputs of the electronic product. Instead, whenever a fault is detected, all the information needed to diagnose the fault exists in the electronic product. More specifically, the random data values that triggered that fault lie at the primary inputs of the electronic product and in the random data information currently stored in the embedded arrays. There is no need to look for any data that was stored in the embedded array in the past and that did not exist at the detection time of the fault.

The typical testing method for electronic products having embedded arrays, however, has numerous shortcomings. First, the initialization of the embedded memory array is a very time consuming effort. It is time consuming because the initialization of all the embedded arrays with random data requires long random pattern sequences to be applied to the primary inputs of the electronic product. The generation and application of long patterns is a comparatively slow operation. Secondly, in order to have an effective test, it is necessary to frequently deliver fresh random data into the embedded array. With every fresh random data delivery, the read test has to be repeated to determine if it can capture any as yet undetected faults.

The present invention is an improved method to test and diagnose electronic products having embedded arrays wherein one or more embedded arrays do not have boundary scan circuits at their inputs and outputs.

2. Background Art

The following documents relate to various methods for testing electronic products having embedded arrays wherein one or more embedded arrays do not have boundary scan circuits at their inputs and outputs.

U.S. Pat. No. 5,062,109 issued 29 Oct. 1991 to Ohshima et al. for "Memory Tester" appears to disclose a memory tester in which data is read out from the memory being tested at an address specified by a pattern generator. The data read out is compared with an expected value. The result of the comparison is written into a failure analysis memory at the address corresponding to that of the memory being tested.

U.S. Pat. No. 4,680,761 issued 14 Jul. 1987 to Burkness for "Self Diagnostic Cyclic Analysis Testing System (CATS) for LSI/VLSI" appears to disclose a testing system wherein a logic device of the product under test is isolated and reconfigured to simulate a non-linear binary sequence generator. The memory elements associated with the logic device are preset to a predetermined value and the logic device is clocked for a given number of steps to define a testing cycle. The settings of the memory elements are compared with the known settings, and a fault condition is indicated when the settings differ from the known settings.

U.S. Pat. No. 4,481,627 issued 6 Nov. 1984 to Beauchesne et al. for "Embedded Memory Testing Method And Apparatus" appears to disclose a method of testing products having embedded arrays through electrical isolation of the combinatorial logic components and the memory array components using high impedance states. This means of electrical isolation enables independent testing of the combinatorial logic components and the memory array components.

U.S. Pat. No. 3,961,252 issued 1 Jun. 1976 to Eichelberger et al. for "Testing Embedded Arrays" appears to disclose a method of testing products having embedded arrays wherein the address registers and the data registers are converted to counters by the addition of an EXCLUSIVE OR circuit connected on two or more positions of the data registers. The address and data registers are stepped through all their states, The data register counter outputs are then compared with the array outputs, thereby enabling verification of address selection as well as enabling verification of the reading or writing operations at each of the embedded array storage locations.

U.S. Pat. No. 3,751,649 issued 7 Aug. 1973 to Hart for "Memory System Exerciser" appears to disclose a memory tester in which stored program instructions govern the data generation, the memory addressing, the read/write operation, and the comparison of data or address values.

IBM Technical Disclosure Bulletin, Vol. 33 No. 1A June 1990 "Method To Access Individual Embedded Arrays via Tester Or External Support Processor In A Way Compatible With Built-In-Self-Test" by Bakoglu et al. appears to disclose a method to read and write individual embedded arrays without disturbing the contents of the other arrays.

IBM Technical Disclosure Bulletin, Vol. 20 No. 6 November 1977 "Random Test Patterns To Logic Surrounding Embedded Arrays" by Goel et al. appears to disclose a method to reduce the testing costs of logic with embedded arrays by determining which test input patterns set will cause a READ/WRITE operation. This set of predetermined inputs reduces the number of input strings which must be applied.

SUMMARY OF THE INVENTION

In the preferred embodiment of the present invention an electronic product having embedded arrays further contains associated memory logic. The associated memory logic further comprises pre-logic circuits, feed-around logic circuits and post-logic circuits. The testing method consists of: (a) initializing the embedded arrays under test with random patterns; (b) selecting at random an address from which to read the initialized random patterns from one or more embedded arrays; (c) reading the initialized random pattern at the randomly selected address from one or more embedded arrays to produce a first set of signal for inputting into the post-logic circuit; (d) applying multiple random patters to the primary inputs of the electronic product, wherein the random pattern input signals propagate through pre-logic circuits and feed-around logic circuits to produce a second set of signals for inputting into the post-logic circuits; (e) producing output patterns on the primary outputs of the electronic product, the output pattern produced from post-logic circuits as a result of the combination of the first set of signals and the second set of signals input into the post-logic circuits; (f) collecting output patterns from the primary outputs in a signature register for determination of an unexpected output pattern X; and (g) repeating steps (b) through (f) to enhance a probability of detecting pattern resistant faults. The testing method further consists, in addition to the above-mentioned testing steps, of a diagnosis of random pattern data stored in a notebook or temporary memory. That is, during an initializing step, the notebook is used to store a previous random pattern data residing at the randomly selected address of the embedded arrays under test. The addition of a notebook facilitates a determination of a failure location of the post-logic by tracking past random pattern data history needed for customary failure analysis examination.

Accordingly, it is an object of the present invention to facilitate the testing, diagnosis, and isolation of faulty associated logic and/or embedded array components in electronic products.

It is also an object of this present invention to facilitate the location of faulty associated logic and/or embedded array components in electronic products.

It is yet another object of this present invention to reduce the time, and therefore the expense, needed for testing, diagnosis, isolation and location of faulty associated logic and/or embedded arrays in electronic products.

Lastly, but not limited hereto, it is an object of the present invention to extend and promote design and test methods for electronic products having embedded arrays.

BRIEF DESCRIPTION OF THE DRAWINGS

The subject matter which is regarded as the invention is particularly pointed out and distinctly claimed in the concluding portion of the specification. The invention, however, both in regards to organization and method of practice, together with further objects and the advantages thereof, may best be understood by reference to the following description taken in connection with the accompanying drawings in which:

DISCLOSURE OF PREFERRED EMBODIMENT

Figure 1:
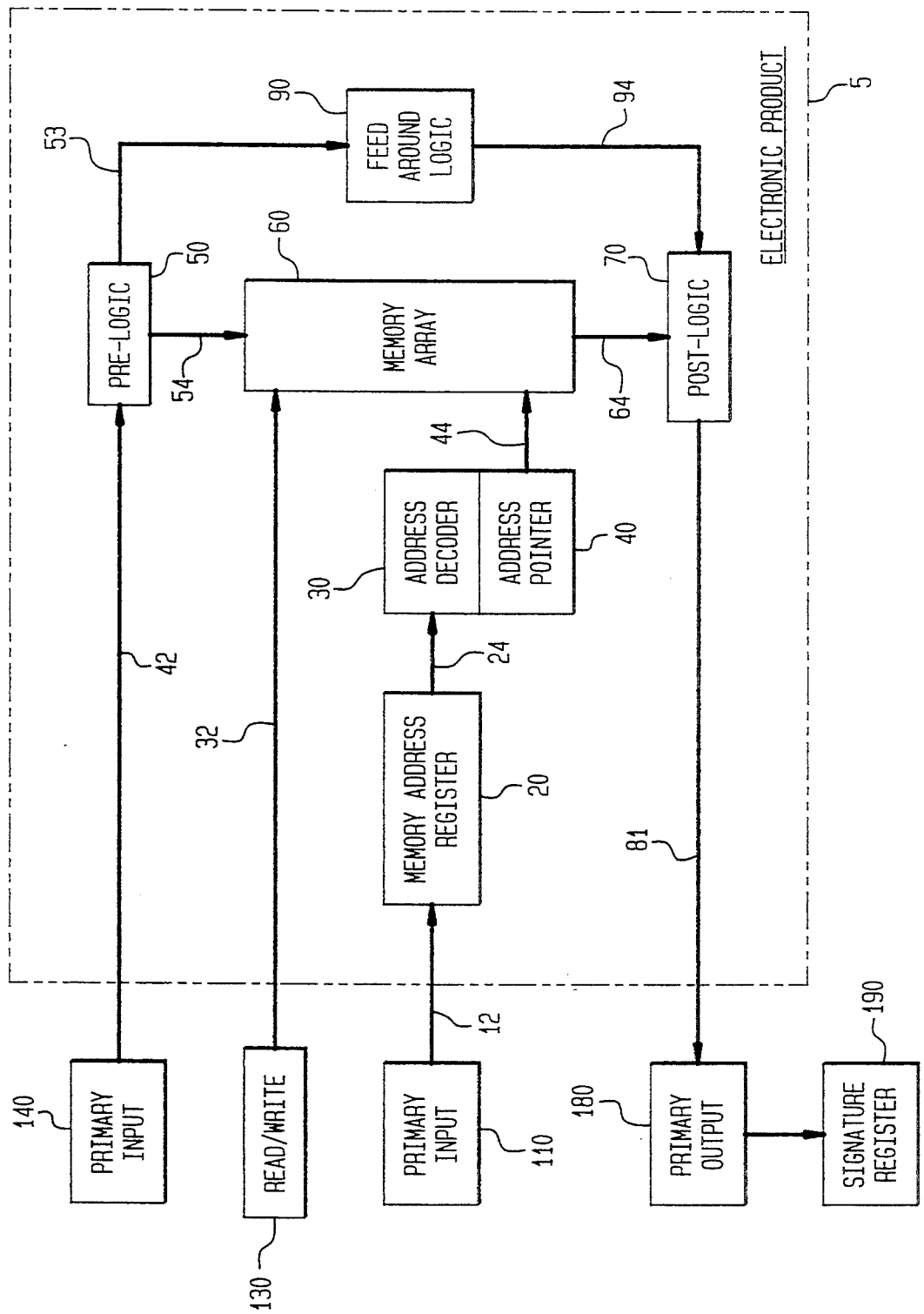
FIG. 1 is a simplified block diagram of a typical electronic product with embedded arrays.

Referring now to FIG. 1, there is depicted an electronic product 5 including first primary input 110 and second primary input 140, primary output 180 and read/write input 130. The primary inputs along with the primary output are the physical pins or connectors through which the electronic product 5 receives and transmits information between electronic product 5 and other external devices. The electronic product 5 further includes one or more embedded arrays 60 (only one shown) not having boundary scan isolation circuitry at respective data inputs and outputs of the one or more embedded arrays 60 (hereinafter described with respect to one embedded array). Data input into embedded array 60 is effected via signal line 54. Data output from embedded array 60 is effected via signal line 64. Read/write input 130 is connected to embedded array 60 via signal line 32, wherein embedded array 60 is in either a read mode or a write mode depending upon the state of a read/write input signal on input 130. First primary input 110 is connected to memory address register 20 via signal line 12. Memory address register 20 is connected to an address decoder 30 via signal line 24. Address decoder 30 contains an address pointer 40 which establishes a current embedded memory array's address during read/write operations. Address pointer 40 is connected to embedded array 60 via signal line 44, A pre-logic 50 typically contains a memory data register (not shown) that supplies random pattern data to the combinatorial pre-logic which correspondingly supplies input data to the input of embedded array 60 via signal line 54. Both memory address register 20 and pre-logic 50 are driven by external devices (not shown) through first primary input 110 and second primary input 140, respectively. Memory address register 20 and the memory data register of pre-logic 50 (not shown) are typically formed from a shift register latch design and/or level scan sensitive (LSSD) design methodologies.

Embedded memory array 60 is surrounded by three different types of logic. First, the aforementioned combinatorial pre-logic 50 supplies the embedded arrays 60 with input data via signal line 54 during array write operations. Second, combinatorial post-logic 70 receives the data from embedded memory array 60 via signal line 64 and feed-around logic 90 via signal line 94 during array read operations. Third, the feed-around logic 90 provides an independent path by passing around embedded array 60 from combinatorial pre-logic 50 via signal line 53 to combinatorial post-logic 70 via signal line 94. Typically the post-logic 70 contains a memory output register (not shown) that feeds the data from combinatorial post-logic 70 to primary output 180 via signal line 81. Primary output 180 transmits information from electronic product 5 to other external devices. As with the memory address register 20 and the memory data register (not shown) of pre-logic 50, the memory output register (not shown) of pre-logic 70 is typically formed from the same design methodologies of shift register latches and/or level scan sensitive design.

Post-logic 70 logically connects the data read out of embedded array 60 via signal line 64 with the data supplied from pre-logic array 50 by feed-around logic 90 via signal line 94. Logical connections in post-logic 70 are formed from a variety of common logic gates including AND, OR, and XOR gates.

The testing method consists of: (a) initializing the embedded array 60 under test with random patterns by operating embedded memory array 60 in a write mode while applying random data to first primary input 110 and second primary input 140; (b) selecting an address using address pointer 40 to select a single random address and holding the selected address for a fixed number of test periods; (c) reading the random pattern at the selected address to produce a first set of signal for inputting into post-logic 70; (d) applying multiple random patterns to second primary input 140 wherein the random pattern input signals propagate through the pre-logic 50 and pass through to feed-around logic 90 to produce a second set of signals for inputting into post-logic 70; (e) producing output patterns on the primary output 180, the output patterns produced from post-logic 70 through the logical connections of the first set of signals with the second set of signals; (f) collecting the output patterns from primary output 180 into a signature register 190 for a determination of unexpected output patterns; and (g) repeating step (b) through step (f) to enhance a probability of detecting pattern resistant faults.

It is important to distinctly point out two features of the present invention. One, the address pointer 40 is only adjusted once during a fixed number of test periods. Adjusting address pointer 40 once prior to a fixed number of test periods greatly enhances the detection probability of a fault by giving the fault a better chance to be detected. Two, before changing address pointer 40 to a new random address, the initialized random pattern in embedded array 60 at the present random address which is selected by address pointer 40 is rewritten with a new random pattern. This rewriting procedure ensures that a fresh initialized pattern is always available in embedded array 60, which in turn enhances the probability of detection of pattern resistant faults in the event address pointer 40 is randomly filled with a previously selected address.

Figure 2:
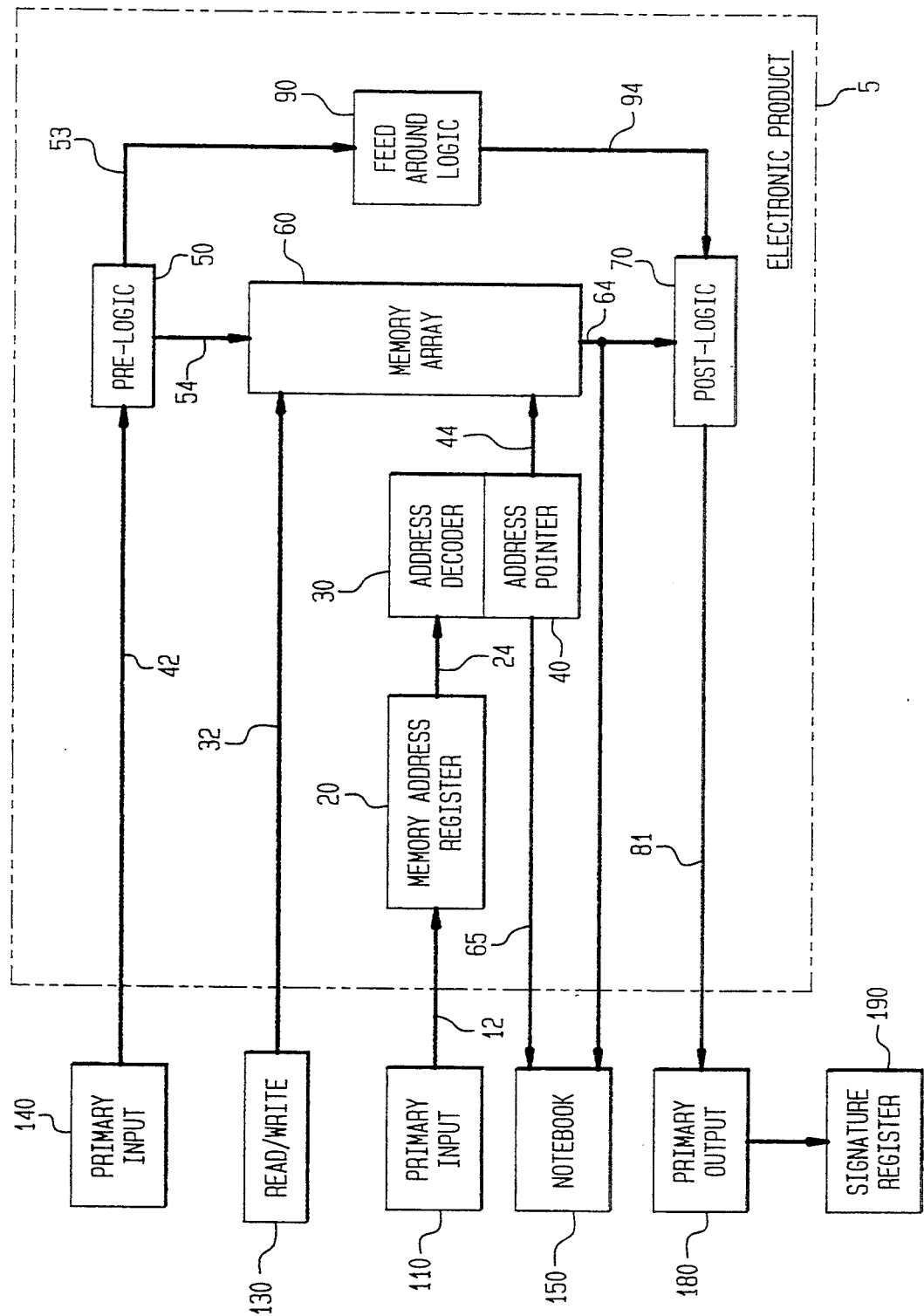
FIG. 2 is a simplified block diagram of a typical electronic product with embedded arrays with the addition of a notebook for enabling diagnosis.

Referring now to FIG. 2, there is depicted an electronic product 5 identical to FIG. 1 but with the addition of a notebook 150. The notebook 150 is a scratch pad memory which may be constructed from a variety of wellknown memory design methodologies.

An alternate embodiment according to the present invention comprises a diagnosis method. The diagnosis method consists of the aforementioned testing steps in addition to a diagnosis of random pattern data stored in notebook 150. That is, in the rewriting step, the notebook is used to store the previous random pattern data residing in the frozen random address, as well as the random address itself, as selected by address pointer 40. Recall that the frozen random address corresponds to the randomly selected address of step (b). The addition of the notebook facilitates a determination of a failure location (i.e., in the post-logic of the electronic product) by tracking past data history for the failure diagnosis. Once the historical data establishes (i) a means of diagnosing the failure location and (ii) a cause of the failure is determined, then a proper corrective action can be carried out.

Lines 12, 24, 32, 42, 44, 53, 54, 64, 65, 81 and 94 provide the necessary electrical connections to the various electronic components.

From the above, it should be appreciated that, through the addition of relatively simple hardware for the diagnosis method, the testing of embedded arrays becomes much easier and more effective to perform. It is also seen that the invention extends and enhances the opportunities for applying the use of embedded arrays in products not utilizing scan boundary design methodologies. It is also seen that the apparatus and method of the present invention provide a more cost effective means for diagnosis, testing, isolation, and location of faults in electronic products having embedded arrays. Lastly, it should be also appreciated that the present invention achieves all the aforementioned objects.

While the invention has been illustrated and and described in the preferred embodiments, many modifications and changes therein may be affected by those skilled in the art. It is to be understood that the invention is not limited to the precise construction herein disclosed. Accordingly, it is intended by the appended claims to cover all such modifications and changes as fall within the true spirit and scope of the invention.

Having thus described our invention, what we claim as new, and desire to secure by Letter Patent is:

1. A method of testing a post-logic of an electronic product, the electronic product including (i) a plurality of first input signal lines connected to an address decoder via a memory address register, the address decoder including an address pointer, (ii) at least one pre-logic circuit, the at least one pre-logic circuit having an input and further having a first output and a second output, (iii) a plurality of second input signal lines connected to the input of the at least one pre-logic circuit, (iv) at least one embedded memory array, the at least one embedded memory array having one or more storage locations, the at least one embedded memory array having a read/write input for selectively placing the at least one embedded memory array in either a read mode, or a write mode in response to a read/write signal on the read/write input, the at least one embedded memory array further having an address input connected to the address pointer of the address decoder for selecting a storage location of the at least one embedded memory array in response to an address signal on the plurality of first input signal lines, the at least one embedded memory array further having a data input connected to the first output of the at least one pre-logic for inputting information into a storage location of the at least one embedded memory array selected by the address pointer during a write mode, the at least one embedded memory array further having a data output for outputting information contained in a storage location of the at least one embedded memory array selected by the address pointer during a read mode, (v) at least one post-logic circuit, the at least one post-logic circuit having a first input and a second input and further having an output, the first input of the at least one post-logic circuit connected to the data output of the at least one embedded memory array, (vi) a plurality of output signal lines connected to the output of the at least one post-logic circuit, and (vii) at least one feed around logic circuit, the at least one feed around logic circuit connected between the second output of the at least one pre-logic circuit and the second input of the at least one post-logic circuit to thereby at least partially embed the at least one embedded memory array, said method of testing comprising the steps of:

(a) initializing the at least one embedded memory array with random bit patterns, said initializing step comprising (i) operating the at least one embedded memory array in a write mode, (ii) applying an address signal to the plurality of first input signal lines to select a storage location of the at least one embedded memory array, (iii) applying a random bit pattern to the plurality of second input signal lines, wherein the random bit pattern is input into the pre-logic circuit, acted upon by the pre-logic circuit, output from the pre-logic circuit on the first output of the pre-logic circuit, and thereby written into the selected storage location, and (iv) repeating sub-steps (ii) and (iii) for one or more storage locations of the at least one embedded memory array;

(b) applying a random address signal to the plurality of first input signal lines to select a storage location of the at least one embedded memory array that has been initialized with random bit patterns in step (a) and holding the applied random address signal for a fixed number of test periods, wherein the selected storage location which has been addressed is held selected for the fixed number of test periods;

(c) for each test period, reading the random bit pattern from the selected storage location of step (b) into the at least one post-logic circuit, said reading step comprising placing the at least one embedded memory array in the read mode for reading data stored at the selected storage location and outputting the read data onto the data output of the at least one embedded memory array to produce a first set of signals;

(d) for each test period, applying a new random bit pattern to the plurality of second input signal lines, wherein the new random bit pattern is input into the pre-logic circuit, acted upon by the pre-logic circuit, .output from the pre-logic circuit on the second output of the pre-logic circuit, input into the feed around logic circuit, acted upon by the feed around logic circuit, and thereafter output from the feed around logic circuit to produce a second set of signals;

(e) for each test period, producing an output pattern, the output pattern being generated through a combination of the first set of signals of step (c) and the second set of signals of step (d) input into the first input and second input of the at least one post-logic circuit, respectively, the at least one post-logic circuit acting upon the first set of signals and the second set of signals, and thereafter outputting the output pattern on the plurality of output signal lines of the electronic product; and (f) for each test period, (i) collecting the output pattern of step (e) from the plurality of output signal lines into a signature register and (ii) performing a signature analysis upon the collected output pattern for a determination of any deviation from an expected output pattern, wherein any such deviation from an expected output pattern constitutes a fault and further wherein the signature analysis corresponds to a fault diagnosis, thereby testing the post-logic of the electronic product.

2. The method of testing a post-logic of an electronic product as in claim 1, said method further including, after step (f), the steps of:

(g) writing a new random bit pattern into the at least one embedded memory array at the selected storage location of step (b), said writing step comprising (i) operating the at least one embedded memory array in a write mode, (ii) applying the random address signal of step (b) to the plurality of first input signal lines, and (iii) applying a new random bit pattern to the plurality of second input signal lines, wherein the new random bit pattern is input into the pre-logic circuit, acted upon by the pre-logic circuit, output from the pre-logic circuit on the first output of the pre-logic circuit, and thereby written into the selected storage location of step (b); and (h) repeating said selecting step (b) through said collecting step (f) a multiple number of times to enhance a probability of detecting a random pattern resistant fault in the at least one post-logic circuit.

3. The method of testing a post-logic of an electronic product as in claim 2, said method further including, in between steps (f) and (g), the step of:

(fg) upon a determination of a fault by the signature analysis of step (f), storing (i) the random bit pattern of the at least one embedded memory array at the selected storage location of step (b) and (ii) the random address signal of step (b) in a notebook, wherein storing the random bit pattern of step (b) and the random address signal of step (b) provides historical information for use in a subsequent determination of a failure location in the post-logic of the electronic product, such subsequent determination of a failure location constituting an enhanced fault diagnosis.

* * * * *